United States Patent [19]

King

[11] Patent Number: 5,107,230

[45] Date of Patent: Apr. 21, 1992

[54] SWITCHED DRIVERS PROVIDING BACKMATCH IMPEDANCE FOR CIRCUIT TEST SYSTEMS

[75] Inventor: Philip N. King, Ft. Collins, Colo.

[73] Assignee: Hewlett-Packard Company, Palo Alto, Calif.

[21] Appl. No.: 692,089

[22] Filed: Apr. 26, 1991

[51] Int. Cl.⁵ ............................................. H03H 11/28
[52] U.S. Cl. ..................................... 333/32; 307/264; 324/158 R
[58] Field of Search ............... 333/32; 324/73.1, 128, 324/158 R; 307/264, 409

[56] References Cited

U.S. PATENT DOCUMENTS

| | | | |
|---|---|---|---|
| 2,768,351 | 10/1956 | Scholten et al. | 333/32 X |
| 3,628,160 | 12/1971 | Pickering | 307/490 X |
| 4,947,106 | 8/1990 | Chism | 324/73.1 |

Primary Examiner—Paul Gensler

[57] ABSTRACT

A driver circuit (10) for selecting particular values of backmatch impedance (Z) for a functional or in-circuit test system. The test system (100) generates the backmatch impedance select signals (32A), the control signals (32B), and the drive data (32C). A decode circuit (200) receives the backmatch impedance select signal and the control signals from the test system for activating one or more of a plurality of individual drivers. Each of the plurality of drivers has a three state control input (202A), a data input (212), and an output (214). Each output of the drivers is connected to an impedance (Z). Hence, a plurality of impedances are provided which are commonly tied together and connected to the transmission line (70). The test system connects one or more of the drivers together. When one driver is selected, that particular value of backmatch impedance is connected to the transmission line. When more than one driver is connected, a resultant parallel impedance value is interconnected to the transmission line. Thus, precise value of backmatch impedance can be connected to the transmission line.

10 Claims, 4 Drawing Sheets

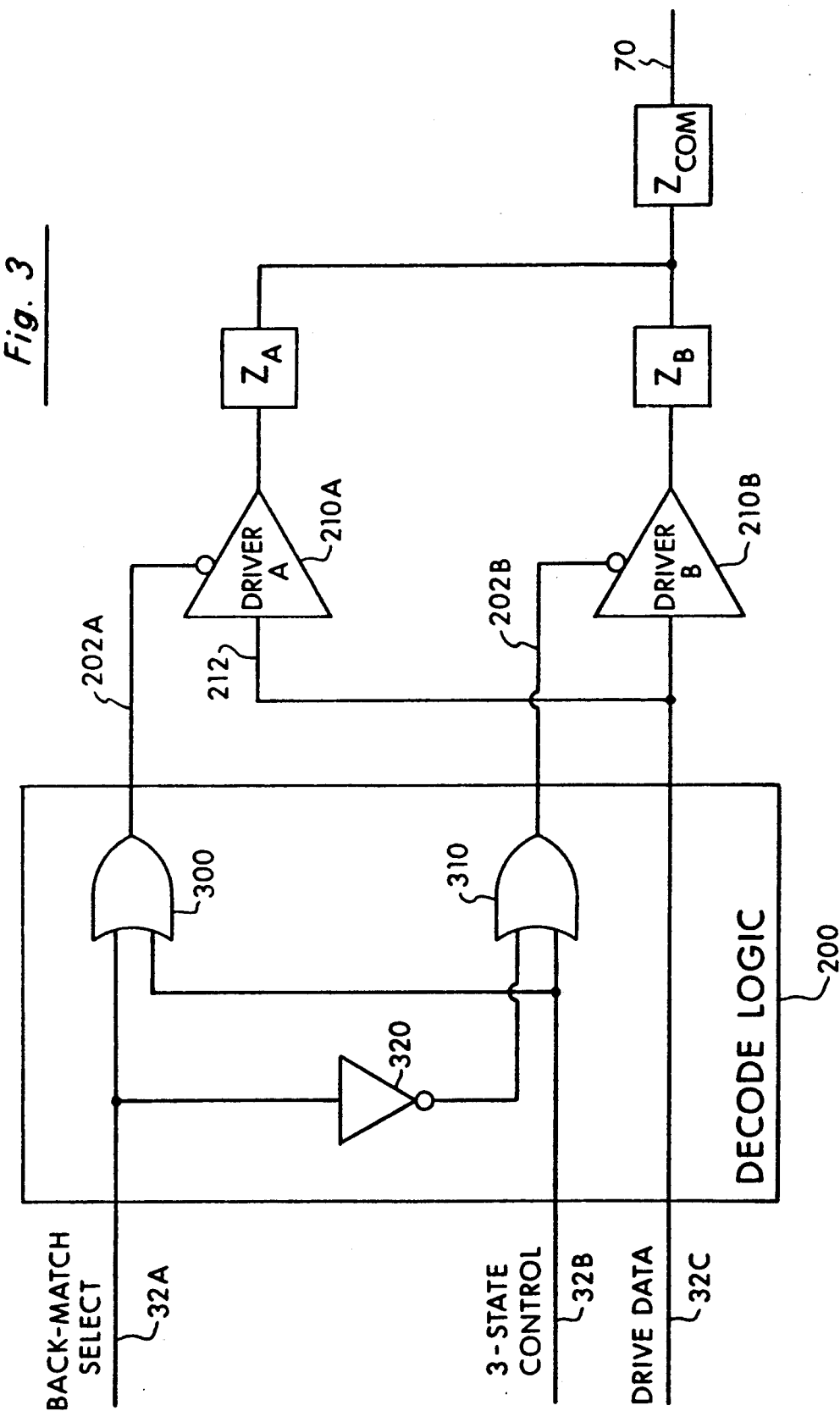

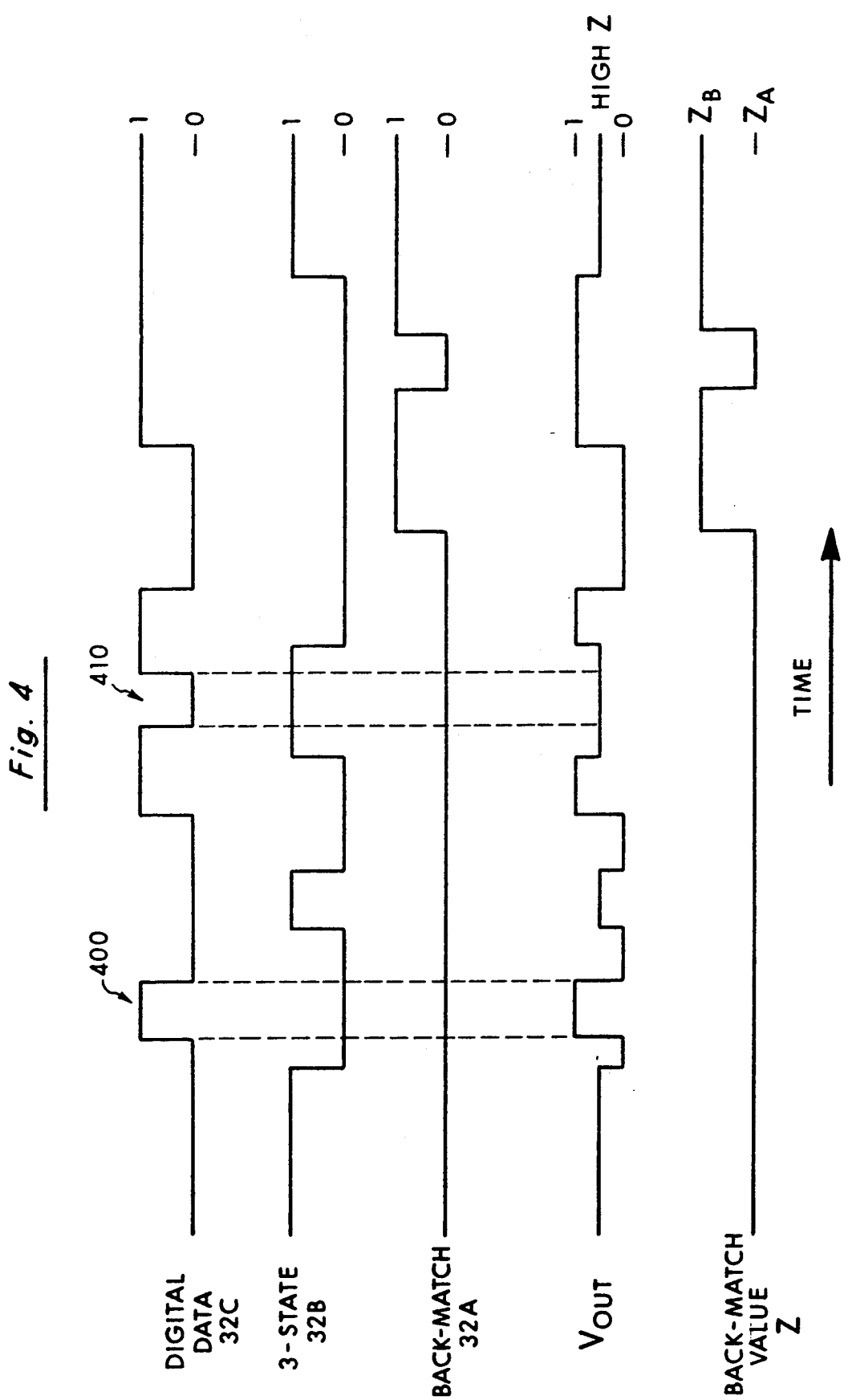

SWITCHED DRIVERS PROVIDING BACKMATCH IMPEDANCE FOR CIRCUIT TEST SYSTEMS

BACKGROUND OF THE INVENTION

1. Field of the Invention

The present invention relates to functional and in-circuit test systems and, more particularly, for providing backmatch impedance between the pin electronics driver and the device under test.

2. Statement of the Problem

Functional and in-circuit testing techniques are frequently utilized to test semiconductor circuits. Such testing systems utilize drivers that connect to transmission lines that in turn are connected to test points or nails in the device-under-test. The impedance between a driver and the test point becomes critical in accurately testing the device under test. Furthermore, such drivers must operate at high speeds such as 25 MHz. Hence, the backmatch impedance of the driver should match the impedance of the transmission line in order to control reflections and to provide an accurate representation of the signal at the device under test. Additionally, differences in the transmission line environment, especially due to fixturing difficulties, may cause impedance mismatching. Hence, a need exists to provide a plurality of different backmatch impedances between the driver and the device under test. Another reason for switching the backmatch resistance is to accommodate a common driver that is used for both in-circuit overdrive and functional testing.

One prior art approach to solving this problem is to provide a number of separate relays with one end of each relay connected to the output of the driver and the other end of each relay connected to a differing value of impedance. The impedances are then connected to the transmission line. Hence, by selectively activating the number of different relays, selected values of impedance can be switched into the transmission line between the output of the driver and the input to the device under test. While this functionally provides a solution to the above problem, the use of relays has several undesirable characteristics. First, such relays are generally expensive, occupy significant circuit board space, consume power which creates undesirable amounts of heat, and cannot switch at the high speeds desired for automated testing.

Hence, a need still exists to selectively provide the proper values of backmatch impedance between the driver and the device under the test in such a manner as to minimize space on the circuit board, reduce power consumption and thereby reduce heat generation, reduce the overall cost, and to operate at high operating speeds such as 25 MHz.

3. Solution to the Problem

The present invention provides a solution to the above problem by providing a plurality of separate driver circuits with each driver being connected to a different value of backmatch impedance. Each of the plurality of driver circuits have their individual backmatch impedances connected to the transmission line for delivering test signals to the device under test. The appropriate driver (and, therefore, the appropriate backmatch impedance) is selected by means of a solid state digital logic selection circuit which is capable of operating at speeds of 25 MHz or greater.

Hence, under the teachings of the present invention, the above problem is solved by selectively activating one of a plurality of available drivers having the desired amount of backmatch impedance. This arrangement is less costly to implement, occupies significantly less space on the circuit board, is capable of operating at high operating speeds, and consumes significantly less power so as to contribute less undesirable heat.

SUMMARY OF THE INVENTION

A driver circuit is provided for selecting particular values of backmatch impedance for a functional or in-circuit test system. The test system generates the backmatch impedance select signals, the control signals, and the drive data.

A decode circuit receives the backmatch impedance select and the control signals from the test system for activating one or more of a plurality of individual drivers which in the preferred embodiment are identical drivers.

Each of the plurality of drivers has a three state control input, a data input, and an output. Each output of the driver is connected to an impedance. Hence, a plurality of impedances are provided which are commonly tied together and connected to the transmission line to the device under test.

The test system connects one or more of the drivers together. When one driver is selected, that particular value of backmatch impedance is connected to the transmission line. When more than one driver is selected, a resultant parallel impedance value is interconnected to the transmission line. Thus, precise value of backmatch impedance can be connected to the transmission line.

BRIEF DESCRIPTION OF THE DRAWING

FIG. 1 is an overall system diagram showing the environment that the present invention operates in;

FIG. 3 is a detailed schematic of the preferred embodiment of the present invention; and FIG. 4 is a timing diagram showing the operation of the circuit of FIG. 3.

DETAILED DESCRIPTION

1. Overview

Figure 1:
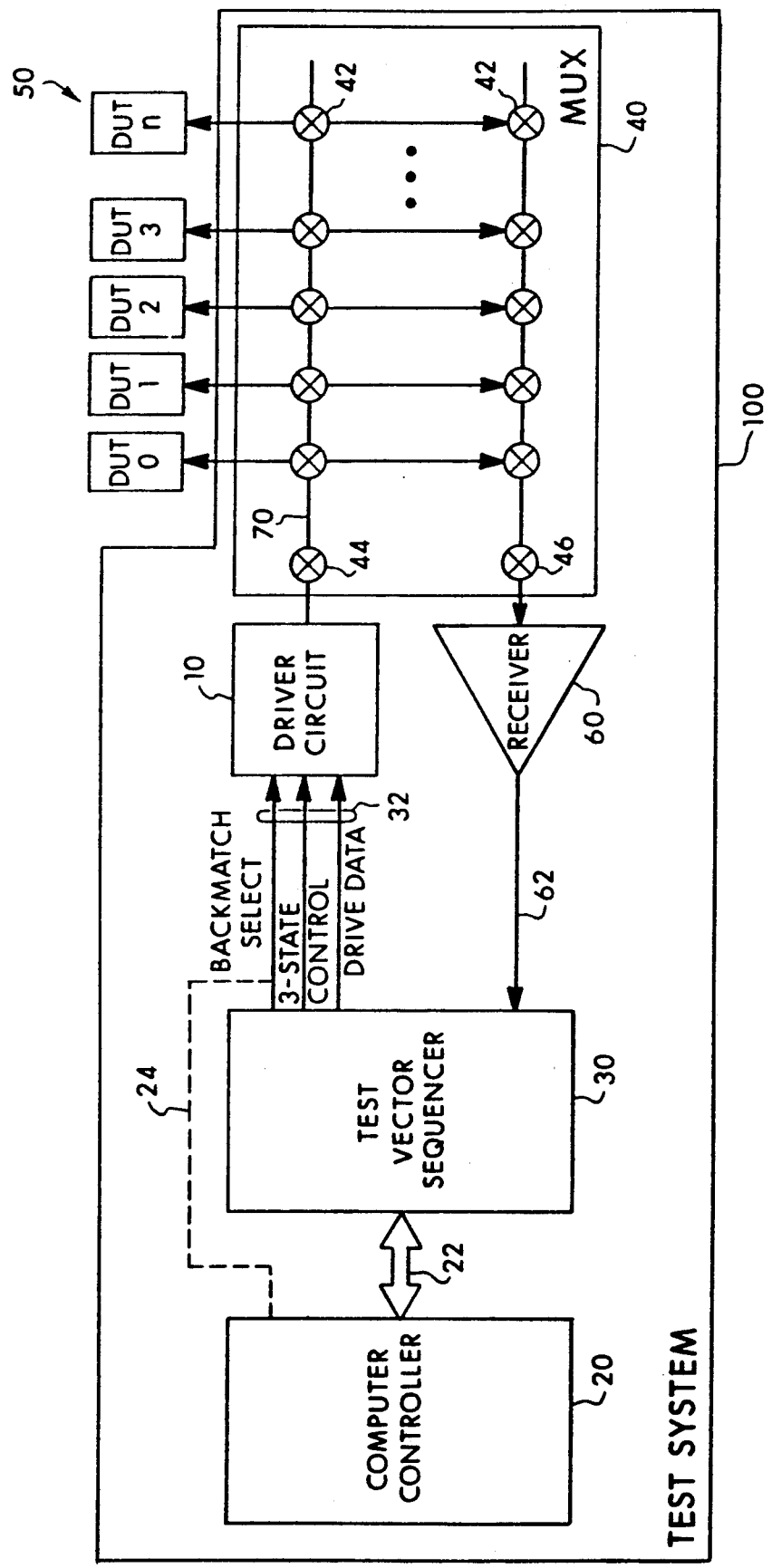

In FIG. 1, the driver circuit 10 of the present invention is shown interconnected into a functional in-circuit (or combinational) test system 100 composed of a computer controller 20, a test vector sequencer 30, a multiplexer 40, a plurality of device under test (DUT) probe locations or pins 50, and a receiver 60. Test vectors are delivered by the sequencer 30 through the driver circuit 10 and the multiplexer 40 to selectively exercise devices under test 50. Data can be delivered back to the sequencer 30 from a device under test 50 through a receiver 60 to check for proper circuit operation. The multiplexer 40 uses relay contacts 42 to selectively interconnect a desired device under test pin to the driver circuit 10 or to the receiver circuit 60. Relays 44 and 46 connect the multiplexer 40 to the driver circuit 10 or to the receiver circuit 60, respectively. The driver circuit 10 drives signals onto a transmission line 70 which connects the output of the driver circuit 10 to the selected device under test pin 50. The transmission line 70 includes elements of the multiplexer 40 and the fixturing between the test system and the DUT 50.

As shown in FIG. 1, the computer controller 20 controls the test vector sequencer 30 over bus 22. The test vector sequencer 30, in turn, controls the driver circuit 10 over lines 32 to provide the backmatch select (32A), provide 3-state control (32B), and provide the drive data (32C). These signal paths will be discussed in greater detail later. Under the teachings of the present invention, the computer controller 20 could also optionally provide the backmatch select over lines 24 directly to the driver circuit 10. The receiver 60 delivers signals from a device under test 50 over lines 62 to the test vector sequencer 30. It is understood that in a typical test system a single sequencer would interface to a plurality of drivers 10 and receivers 60.

It is to be expressly understood that combinational testing systems are conventionally available and that the present invention provides an improvement with respect to providing backmatch impedance as discussed in the "Solution to the Problem" section above. An example of such a conventional combinational test system is the Hewlett-Packard HP 3070 system marketed by the assignee of the present invention.

It is to be expressly understood that the system configuration of FIG. 1 shows a preferred system environment for placement of the present invention. The teachings of the present invention, however, are not limited to this environment.

2. Generalized Driver of the Present Invention

Figure 2:
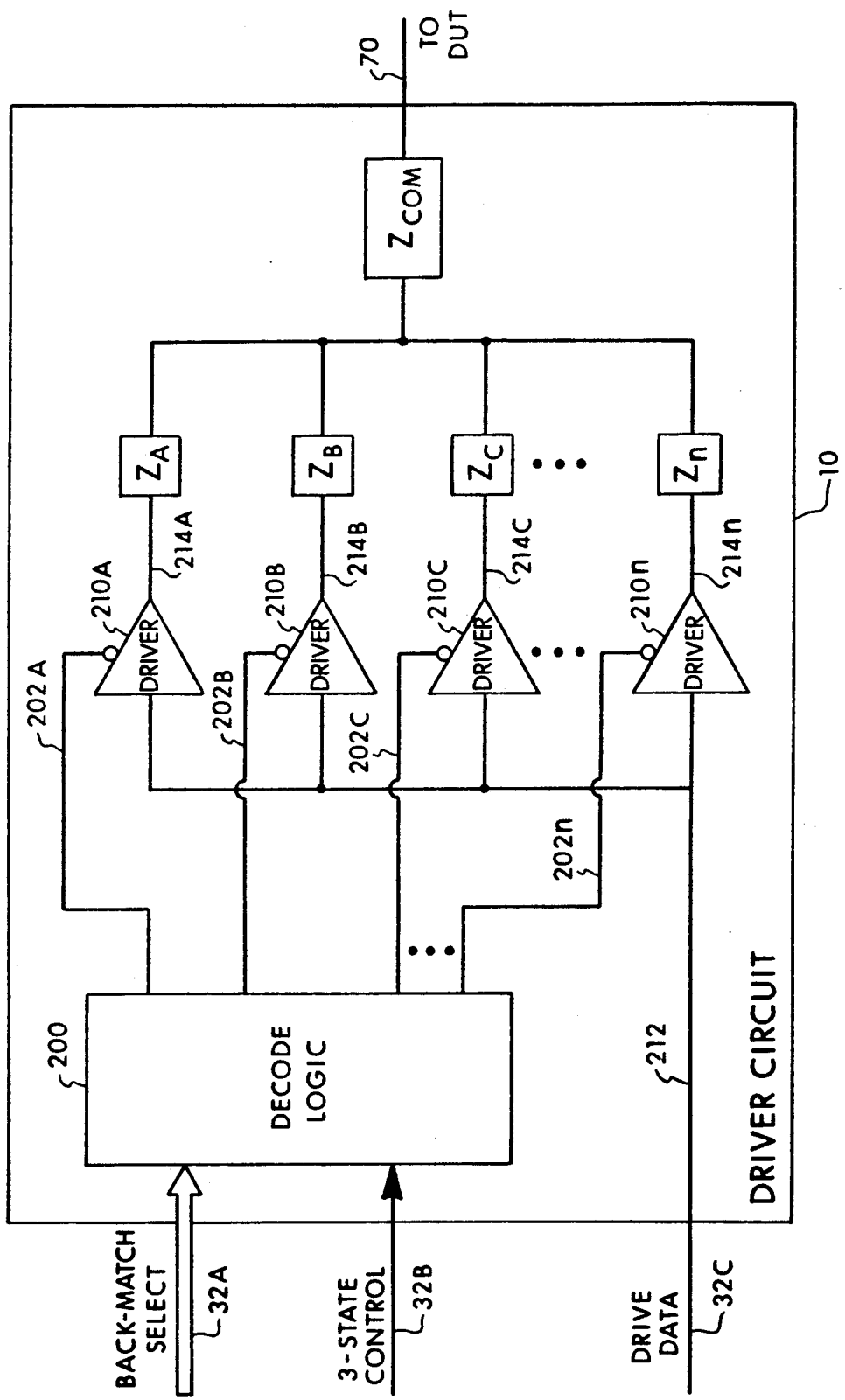
FIG. 2 is the block diagram of the generalized circuit of the present invention.

In FIG. 2, the details of the driver circuit 10 of FIG. 1 are set forth. FIG. 2 represents a generalized case wherein a plurality of backmatch impedance values $Z_A$ through $Z_N$ are provided under the teachings of the present invention. In FIG. 2, the driver circuit 10 is shown with its input signals on lines 32 and with its output connected to transmission line 70. The driver circuit 10 comprises a decode logic circuit 200 which is interconnected with drivers 210A, 210B, 210C, and 210N. Each driver 210 is interconnected to the drive data line 32C and is receptive of digital signals at a rate between DC and at least 25 MHz. The driver is conventionally available as a line driver with 3-state output such as that from Hitachi America, Ltd., 2210 O'Toole Avenue, San Jose, Calif. 94131 as Model No. HD74AC125. The three outputs are a binary zero (i.e., $V_{OUT}=0$ volts), a binary one (i.e., $V_{OUT}=5$ volts) and a high impedance (i.e., High Z). It is to be understood that the drivers may be identical or, in some cases, non-identical depending upon the system requirements.

The decode logic 200, to be described subsequently, receives the backmatch select signals on lines 32A. As mentioned, these signals can come from either the test vector sequencer 30 or the computer controller 20 of FIG. 1. The decode logic 200 receives the code on lines 32A and selects one or a unique combination of drivers 210. The decode logic 200 also receives a 3-state control signal over lines 32B which will be discussed subsequently.

Each driver 210 is interconnected with a unique impedance $Z_A$ through $Z_N$. Typically, each value of impedance Z is different. In addition, each impedance Z is interconnected with a common impedance $Z_{COM}$ whose output is connected to the transmission line 70. The use of $Z_{COM}$ is optional and need not be present.

It is to be expressly understood that any number of drivers 210 can be utilized under the teachings of the present invention. Furthermore, the impedance Z can be of differing or of the same values, and can be any real or complex impedance.

EXAMPLE I

If driver 210A is activated, then the data on line 32C is driven onto the transmission line 70 through the following backmatch impedance:

FORMULA 1:
$$Z_{BM} = Z_A + Z_{COM}$$

where $Z_{BM}$ = Backmatch impedance

EXAMPLE II

If two drivers 210A and 210B are activated, then the data on line 32C is driven onto this transmission line 70 through a backmatch impedance which equals:

FORMULA 2:
$$Z_{BM} = \frac{Z_A \cdot Z_B}{Z_A + Z_B} + Z_{COM}$$

Hence, a number of different backmatch impedance values can be easily formatted.

3. Specific Embodiment

The configuration of FIG. 2 is the general case and in FIG. 3, a specific implementation of the present invention is set forth.

In FIG. 3, two identical drivers, driver A and driver B, are utilized. Driver A is interconnected with impedance $Z_A$ and driver B is interconnected with impedance $Z_B$. In the preferred embodiment, impedance $Z_A$ is conventionally available as a ferrite bead resistor having a DC value of approximately zero ohms and a 100 MHz value of 70 ohms. This is conventionally available from TDK as Model No. CB30-322513. Impedance $Z_B$, in this embodiment, is zero ohms and constitutes simply a wire. Impedance $Z_{com}$ is a resistor having a value of 33.75 ohms.

The decode logic circuit 200 is composed of two OR-gates 300 and 310. OR-gates 300 and 310 are available from National Semiconductor as Models 54AC/74AC32. An inverter 320 is also utilized.

The backmatch select line 32A inputs to gate 300 and to inverter 320. The 3-state control line 32B also inputs the two OR-gates, 300 and 310.

The decode logic 200 operates as follows:

TABLE I

| | | TRUTH TABLE | | |
|---|---|---|---|---|
| Digital Data 32B | 3-State Control Signal 32B | Backmatch Signal 32A | Backmatch Impedance $Z_{BM}$ | $V_{out}$ (Volts) |
| 0 | 0 | 0 | $Z_A + Z_{COM}$ | 0 |
| 0 | 0 | 1 | $Z_B + Z_{COM}$ | 0 |
| 1 | 0 | 0 | $Z_A + Z_{COM}$ | 5 |
| 1 | 0 | 1 | $Z_B + Z_{COM}$ | 5 |
| X | 1 | X | Irrelevant | High-Z |
| X - Don't Care | | | | |

The above Truth Table is applied directly to FIG. 3 and can be explained with reference to the timing of FIG. 4.

EXAMPLE 3

In FIG. 4, at time 400, the digital data value is 1, the 3-state value is 0, and the backmatch impedance value is 0. This corresponds to the third line of Table I and the output impedance, $Z_{BM}$, is $Z_A + Z_{COM}$. The voltage, $V_{OUT}$ is a binary one (i.e., 5 volts). In FIG. 4 it shows that the value of $Z_A$ is switched in.

EXAMPLE 4

When the 3-state value is 1 such as at time 410 in FIG. 4, the remaining values of the digital data and the backmatch are immaterial. A high impedance output (HIGH-Z) is delivered at $V_{OUT}$. As shown in FIG. 4, therefore, whenever the 3-state signal is high, the $V_{OUT}$ value is a high impedance (i.e., High-Z). This is reflected in the last line of Table I.

The operation of the present invention is clearly shown in Table I and FIG. 4. The impedance $Z_A$ or $Z_B$ is combined with $Z_{COM}$ at selection rates up to at least 25 MHz. It is to be expressly understood, while the circuit of FIG. 3 is a preferred circuit, any suitable circuit can be utilized as under the teachings of the present invention to accomplish the effect illustrated in Table I and FIG. 4.

It should be noted that the 25 MHz limit mentioned in several places herein is based on the sequencer and driver circuitry and the DUT fixturing chosen for the preferred embodiment. It is understood that there is circuitry and fixturing available to extend the operation of this technique to frequencies in excess of 100 MHz, and that future advances in circuitry and fixturing can be expected to extend the operating frequency of this technique.

4. Advantages

As set forth in the solution to the problem section, four significant advantages are present under the teachings of the present invention. First, as illustrated in FIG. 4, switching speeds for setting the backmatch impedance value can occur up to 25 MHz. Compared with the conventional relay approach, relays are capable of approximately 1 KHz switching speeds. Second, the present invention utilizes less space on a circuit board. The present invention, as shown in FIG. 3, would utilize four logic gate drivers to provide two channels of pin electronics drivers. This would occupy about 0.24 square inches on a circuit board. A prior art approach utilizing two logic gate drivers and four relays would occupy approximately 0.92 square inches. Third, with respect to the power advantage, the present invention utilizes four logic gate drivers consuming eight milliwatts of power. A prior art approach using two logic gate drivers and two active relays would consume approximately 844 milliwatts in power. Finally, present costs of the present invention for four logic gate drivers would be about $.50 and a relay approach utilizing two logic gates and four relays would be about $4.25.

It is to be expressly understood that the claimed invention is not to be limited to the description of the preferred embodiment but encompasses other modifications and alterations within the scope and spirit of the inventive concept.

I claim:

1. A driver circuit (10) for providing backmatch impedance for a test system connected over a transmission line (70) to a device under test (50), said driver circuit comprising:
   means (20, 30) for generating backmatch impedance select (32A), control (32B) and drive data (32C) signals,
   a plurality of drivers (210), each of said drivers having a control input (202), a data input (212), and an output (214), said data input being connected to said drive data,
   a plurality of impedances (Z), each one of said impedances having a first end connected to said output (214) of each one of said plurality of drivers, the second ends of said plurality of impedance being connected together to said transmission line (70),
   means (200) receptive of said backmatch impedance select signals (32A) and said control signals (32B) and connected to said control inputs for activating one or more of said plurality of drivers so as to interconnect a desired value of backmatch impedance to said transmission line.

2. The driver circuit of claim 1 further comprising a common impedance ($Z_{COM}$) connected between said transmission line (70) and said second ends of said plurality of impedances (Z).

3. The driver circuit of claim 1 wherein one of said plurality of impedances is approximately zero ohms.

4. The driver circuit of claim 1 wherein all of said plurality of drivers are identical.

5. The driver circuit of claim 1 wherein each of said drivers is a three way control driver having a zero output, a one output, and a high impedance (High-Z) output.

6. A driver circuit (10) for providing backmatch impedance for a test system connected over a transmission line (70) to a device under test (50), said driver circuit comprising:
   means for generating backmatch impedance select signals (32A), control signals (32B) and drive data (32C),
   a plurality of drivers (210), each of said drivers having a control input (202), a data input (212), and an output (214), said data input being connected to said drive data,
   a common impedance ($Z_{COM}$) connected to said transmission line (70),
   a plurality of impedances (Z), each one of said impedances having a first end connected to said output (214) of each one of said plurality of drivers, the second ends of said plurality of impedance being connected together to said common impedance (70), and means (200) receptive of said backmatch impedance select signals (32A) and said control signals (32B) and to said control inputs for activating one or more of said plurality of drivers,
   means (200) receptive of said backmatch impedance select signals (32A) and said control signals (32B) and to said control inputs for activating one or more of said plurality of drivers so as to interconnect a desired value of backmatch impedance to said common impedance ($Z_{COM}$).

7. The driver circuit of claim 6 wherein one of said plurality of impedances is approximately zero ohms.

8. The driver circuit of claim 6 wherein all of said plurality of drivers are identical.

9. The driver circuit of claim 6 wherein each of said drivers is a three way control driver having a zero output, a one output, and a high impedance (High-Z) output.

10. A low power, high speed driver circuit (10) for providing backmatch impedance for a test system connected over a transmission line (70) to a device under test (50), said driver circuit comprising:
    means for generating backmatch impedance select signals (32A), control signals (32B) and drive data (32C),
    a plurality of identical low power drivers (210), each of said drivers having a control input (202), a data input (212), and an output (214), said data input being connected to said drive data, each of said drivers having a three state output of zero, one, and a high impedance (High-Z), a common impedance ($Z_{COM}$) connected to said transmission line (70), a plurality of impedances (Z), one of said impedances having a first end connected to said output (214) of each one of said plurality of drivers, the second ends of said plurality of impedance being connected together to said common impedance, means (200) receptive of said backmatch impedance select signals (32A) and said control signals (32B) and connected to said control inputs for activating one or more of said plurality of drivers at high speeds up to 25 MHz so as to interconnect a desired value of backmatch impedance to said transmission line.

* * * * *